United States Patent
Rogers et al.

(10) Patent No.: US 11,011,389 B2
(45) Date of Patent: May 18, 2021

(54) ADDITIVELY MANUFACTURED FLEXIBLE INTERPOSER

(71) Applicant: The Boeing Company, Chicago, IL (US)

(72) Inventors: John E. Rogers, Owens Cross Roads, AL (US); John Dalton Williams, Decatur, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/390,256

(22) Filed: Apr. 22, 2019

(65) Prior Publication Data
US 2020/0335357 A1    Oct. 22, 2020

(51) Int. Cl.
*H01L 21/48* (2006.01)
*H01L 23/31* (2006.01)
(Continued)

(52) U.S. Cl.
CPC ........ *H01L 21/481* (2013.01); *H01L 21/4846* (2013.01); *H01L 23/315* (2013.01);
(Continued)

(58) Field of Classification Search
CPC . H01L 2224/06137; H01L 2224/06147; H01L 2224/06157; H01L 2224/06167;
(Continued)

(56) References Cited

U.S. PATENT DOCUMENTS

| 7,915,718 B2* | 3/2011 | Lee ................... H01L 21/563 257/668 |
| 9,508,667 B2* | 11/2016 | Prack ............... H01L 23/49816 |

(Continued)

OTHER PUBLICATIONS

Yim, M.J., et al., "Microwave model of anisotropic conductive film flip-chip interconnections for high frequency applications," IEEE Transactions of Components and Packaging Technology, vol. 22, No. 4, Dec. 1999.

(Continued)

*Primary Examiner* — Sonya McCall-Shepard
(74) *Attorney, Agent, or Firm* — Parsons Behle & Latimer

(57) ABSTRACT

A semiconductor device assembly and method of providing a semiconductor device assembly. The method includes providing a flexible interposer, providing a first redistribution layer on the flexible interposer, and providing a second redistribution layer on a portion of the first redistribution layer. The second redistribution layer is provided by additive manufacturing. The first redistribution layer may be deposited in a clean room environment. The first redistribution layer may be deposited via chemical deposition or physical deposition. A semiconductor device is attached to the first redistribution layer. The flexible interposer may be attached to a board with the semiconductor device being electrically connected to the board via the first redistribution layer, the flexible interposer, and the second redistribution layer. The flexible interposer may be attached to a flexible hybrid electronic (FHE) board. The flexible nature of the flexible interposer and/or the FHE board may redistribute stress on the semiconductor device assembly.

20 Claims, 4 Drawing Sheets

(51) Int. Cl.
*H01L 23/498* (2006.01)
*H01L 23/00* (2006.01)
*H01L 23/538* (2006.01)

(52) U.S. Cl.
CPC .... *H01L 23/4985* (2013.01); *H01L 23/49894* (2013.01); *H01L 24/27* (2013.01); *H01L 24/33* (2013.01); *H01L 24/83* (2013.01); *H01L 23/5389* (2013.01); *H01L 2924/1579* (2013.01)

(58) Field of Classification Search
CPC . H01L 2224/06182; H01L 2224/06187; H01L 2225/1041; H01L 2225/107; H01L 24/97; H01L 2224/97; H01L 23/3114; H01L 24/94; H01L 2224/94; H01L 23/498–49894; H01L 23/538–5387; H01L 21/4846–4867; H01L 21/4807–481; H01L 2224/023–024; H01L 23/4985; H01L 23/5387; H01L 24/18–25; H01L 2224/2101; H01L 2224/2105; H01L 2224/211; H01L 2224/214; H01L 2224/215; H01L 2224/221; H01L 2224/224; H01L 2224/2401–24998; H01L 2224/2501–255; H01L 23/14
See application file for complete search history.

(56) References Cited

U.S. PATENT DOCUMENTS

| | | | |
|---|---|---|---|
| 2014/0022736 A1* | 1/2014 | Podval | H05K 1/0296 361/728 |
| 2014/0138846 A1* | 5/2014 | Blanchard | H01L 21/288 257/774 |
| 2019/0043794 A1* | 2/2019 | Kapusta | H01L 21/56 |
| 2019/0124764 A1* | 4/2019 | Li | H05K 1/189 |
| 2019/0373734 A1* | 12/2019 | King | H01M 2/028 |

OTHER PUBLICATIONS

Yim, M.J., et al., "Flip chip interconnection with anisotropic conductive adhesives for RF and high frequency applications," IEEE, Electronic Components and Technology Conference, Dec. 2003.

Gutierrez, C., et al., "CubeSat fabrication through additive manufacturing and micro-dispensing," International Symposium on Microelectronics, 2011.

Tehrani, B.K., et al., "Inkjet-printed 3D interconnects for millimeter-wave system-on-package solutions," IEEE International Microwave Symposium, May 2016.

Taylor, C.L., et al., "Low-temperature assembly of surface-mount device on flexible substrate using additive printing process," 2018 IEEE 68th Electronic Components and Technology Conference, May 2018.

* cited by examiner

ADDITIVELY MANUFACTURED FLEXIBLE INTERPOSER

FIELD OF THE DISCLOSURE

The examples described herein relate to semiconductor device assemblies and methods of providing semiconductor device assemblies.

BACKGROUND

Description of the Related Art

Flexible hybrid electronics (FHE) have received high interest in recent years for potential low cost, reduced size, weight, and/or power, and being flexible in nature. Flexible hybrid electronics are defined as the intersection between flexible electronics and 3D printed electronics. However, there are limitations with exiting additive manufacturing processes, such as 3D printing, in integrating semiconductor devices with FHE boards. For example, there are limitations on the size of attachment features, such as the size of pads and spacing, that may be formed by additive manufacturing processes. Semiconductor devices may require pads and spacing that are smaller than 30 µm, which are not possible to be additively manufacturing with present processes. Currently, attachment features such as dielectric ramps, anisotropic conductive film, and anisotropic paste are used to attach a semiconductor device to a FHE board. These approaches have peripheral pitch limitations. Other disadvantages of semiconductor device assemblies and present methods of providing semiconductor device assemblies may exist.

SUMMARY

The present disclosure is directed to semiconductor device assemblies and methods of providing semiconductor device assemblies.

One example of the present disclosure is a method of providing a semiconductor device assembly. The method includes providing a flexible interposer and providing a first redistribution layer on the flexible interposer. The method includes providing a second redistribution layer on a portion of the first redistribution layer, wherein the second redistribution layer is provided on the portion of the first redistribution layer by additive manufacturing. The method includes attaching a semiconductor device to the first redistribution layer on the flexible interposer.

The flexible interposer may be more flexible than the semiconductor device. The additive manufacturing may include 3D printing the flexible interposer. The first redistribution layer may include attachment features smaller than 30 µm. The method may include attaching the flexible interposer to a board via the second redistribution layer. The board may be an FHE board.

The first redistribution layer may be deposited on the flexible interposer. The first redistribution layer may be deposited onto the flexible interposer in a clean room environment. Depositing the first redistribution layer may include depositing the first redistribution layer via chemical deposition or physical deposition. Chemical deposition may include plasma enhanced chemical vapor deposition, atomic layer deposition, molecule layer deposition, or the like. Physical deposition may include physical vapor deposition, thermal evaporation, sputtering deposition, or the like.

One example of the present disclosure is an embodiment of a semiconductor device assembly. The semiconductor device assembly includes a flexible interposer having a first surface and a second surface opposite of the first surface. The semiconductor device assembly includes a first redistribution layer deposited onto the first surface of the flexible interposer, wherein the first redistribution layer includes attachment features smaller than 30 µm. The semiconductor device assembly includes a second redistribution layer 3D printed onto a portion of the first redistribution layer. The semiconductor device assembly includes a semiconductor device attached to the first surface of the flexible interposer via the first redistribution layer.

The flexible interposer may be more flexible than the semiconductor device. The flexible interposer may be comprised of one of acrylonitrile butadiene styrene, polylactic acid, high impact polystyrene, thermoplastic polyurethane, polydimethylsiloxane, epoxy-based negative photoresist, liquid crystal polymer, a combination thereof, or the like. The first redistribution layer may be comprised of one of gold, titanium, silver, copper, aluminum, platinum, a combination thereof, or the like. The second redistribution layer may be comprised of one of silver-based conductive ink, copper-based conductive ink, platinum-based conductive ink, a combination thereof, or the like. The semiconductor device assembly may include a board, wherein the flexible interposer is attached to the board via the second redistribution layer and wherein the semiconductor device is electrically connected to the board via the first redistribution layer, the flexible interposer, and the second redistribution layer. The semiconductor device assembly may include additional layers attached to the board, wherein the flexible interposer and semiconductor device are positioned within a cavity within the board.

One example of the present disclosure is a method of manufacturing a semiconductor device assembly. The method includes 3D printing a flexible interposer, the flexible interposer having a first surface and a second surface opposite of the first surface. The method includes depositing a first redistribution layer on the first surface of the flexible interposer, wherein the first redistribution layer is deposited in a clean room environment. The method includes 3D printing a second redistribution layer on a portion of the first redistribution layer. The method includes attaching a semiconductor device to the flexible interposer via the first redistribution layer. The method includes attaching the flexible interposer to a board via the second redistribution layer, wherein the semiconductor device is electrically connected to the board via the first redistribution layer, the flexible interposer, and the second redistribution layer. Depositing the first redistribution layer may comprise depositing the first redistribution layer via chemical deposition or physical deposition.

Figure 1:
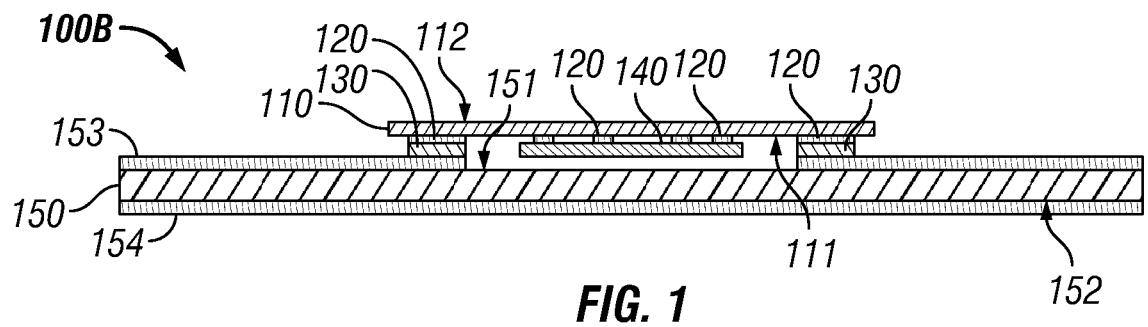
FIG. 1 is a schematic cross-sectional view of an embodiment of semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

FIG. 1 shows an embodiment of a semiconductor device assembly 100B. The semiconductor device assembly 100B includes a semiconductor device 140 electrically connected to a board 150 via a first redistribution layer 120 and a second redistribution layer 130 deposited on a portion of the first redistribution layer 120 located on a first surface 111 of a flexible interposer 110. The flexible interposer 110 includes a first surface, or side, 111 opposite a second surface, or side, 112. The flexible interposer 110 may be manufactured by an additive manufacturing process, such as, but not limited to, 3D printing. 3D printing builds a 3D object by adding layers of material onto other layers of material using a printer until the object is fabricated. Additive manufacturing may be used to fabricate a component having internal electrical flow paths as would be appreciated by one of ordinary skill in the art having the benefit of this disclosure.

A first redistribution layer 120 is deposited onto the first surface 111 of the flexible interposer 110. A second redistribution layer 130 is deposited onto a portion of the first redistribution layer 120 located on the first surface 111 of the flexible interposer 110. The second redistribution layer 130 may be deposited onto the portion of the first redistribution layer 120, as shown in FIG. 1, to electrically connect the first redistribution layer 120 to the second redistribution layer 130. Each of the first and second redistribution layers 120, 130 are connected to flow paths (not shown), which may be internal, of the flexible interposer 110 to enable electrical communication between a device connected to the first redistribution layer 120 and a device connected to the second redistribution layer 130 as would be appreciated by one of ordinary skill in the art having the benefit of this disclosure. The first redistribution layer 120 may be deposited onto the first surface 111 of the flexible interposer 110 via a different method or mechanism than how the second redistribution layer 130 is deposited onto the portion of the first redistribution layer 120.

For example, the second redistribution layer 130 may be deposited or provided onto the portion of the first redistribution layer 120 via an additive manufacturing process. Additive manufacturing is a process that builds a 3D object by the addition of layers of material such as, but not limited to, 3D printing, rapid prototyping, direct digital manufacturing, layered manufacturing and additive fabrication, or the like. Additive manufacturing builds an object by adding successive layers of liquid, powder, sheet material, or the like. Various materials may be used in additive manufacturing such as, but not limited to, plastic, metal, concrete, a combination of such materials, or the like. Additive manufacturing of conductive ink materials can be performed using liquid dispense, aerosol jet dispense, ink-jet dispense, screen printing, or the like. For example, the second redistribution layer 130 may be 3D printed onto a portion of the first redistribution layer 120 located on the first surface 111 of the flexible interposer 110 to electrically connect the first redistribution layer 120 to the second redistribution layer 130. 3D printing may not be adequate for the deposition of the first redistribution layer 120. For example, the first redistribution layer 120 may include attachment features that are smaller than 30 μm, which may not be possible to deposit via an existing additive manufacturing process.

The first redistribution layer 120 may be deposited onto the first surface 111 of the flexible interposer 110 via a depositing process performed in a clean room environment. A clean room is an environment typically used in manufacturing, such as for semiconductor electronic devices. A clean room is a controlled environment that has a low level of various potential contaminants, such as dust, airborne microbes, aerosol particles, chemical vapors, or the like. Clean room environments are contained spaces where provisions are made to reduce particulate contaminations and potentially also control other environmental parameters such as humidity, pressure, air flow, electromagnetic fields, and/or temperature.

The first redistribution layer 120 may be deposited via a process performed in a clean room environment that enables the formation of a redistribution layer having attachment features smaller than 30 μm. For example, the first redistribution layer 120 may be deposited via a chemical deposition process or a physical deposition process. The first redistribution layer 120 may be deposited via chemical vapor deposition, plasma enhanced chemical vapor deposition, atomic layer deposition, molecular layer deposition, or the like. The first redistribution layer 120 may be deposited via physical vapor deposition, thermal evaporation, sputtering deposition, or the like.

A semiconductor device 140, such as, but not limited to an electronic chip, may be attached to the flexible interposer 110 via the first redistribution layer 120. The first redistribution layer 120 is configured to enable the semiconductor device 140 to be electrically connected to the flexible interposer 110 via the first redistribution layer 120. The flexible interposer 110 may be more flexible than the semiconductor device 140. The flexible nature of the flexible interposer 110 may redistribute stress on the semiconductor device assembly 100B during bending, which may increase the likelihood that the electrical connection between the flexible interposer 110 and the semiconductor device 140 remains intact. The deposition of the first redistribution layer 120 via a clean room process may enable an electrical connection to be configured to connect to a semiconductor device 140 that could not be provided by additive manufacturing.

The semiconductor device assembly 100B includes a board 150. The board 150 includes a first surface, or side, 151 and a second surface, or side, 152. The first surface 151 of the board 150 may include an electrical flow path 153, which may be used to electrically connect the board 150 to another device as would be appreciated by one of ordinary skill in the art having the benefit of this disclosure. The second surface 152 of the board 150 may include a ground plane 154.

The flexible interposer 110 is attached to a board 150 via the second redistribution layer 130. As discussed herein, the second redistribution layer 130 may be formed on a portion of the first redistribution layer 120 via an additive manufacturing process. As discussed herein, the second redistribution layer 130 may be formed on a portion of the first redistribution layer 120 to electrically connect the second redistribution layer 130 to the first redistribution layer 120. The second redistribution layer 130 electrically connects the flexible interposer 110 to the board 150. The semiconductor device 140 is electrically connected to the board 150 via the first redistribution layer 120, the electrical paths (not shown) of the flexible interposer 110, and the second redistribution layer 130. The board 150 may be used to electrically connect the semiconductor device 140 to various electronic components as would be appreciated by one of ordinary skill in the art having the benefit of this disclosure. For example, the board 150 may be configured to connect the semiconductor device 140 to a specified component.

The board 150 of the semiconductor device assembly 100B may be various electronic boards available as would be appreciated by one of ordinary skill in the art having the benefit of this disclosure. For example, the board 150 may be a FHE board. Flexible hybrid electronics combine the process of additive manufacturing, such as 3D printing, with traditional electronic architectures. For example, the board 150 may be comprised of a flexible material and include both printed components and advanced complementary metal-oxide-semiconductor (CMOS) based components. The flexible nature of a FHE board may redistribute stress on the semiconductor device assembly 100B during bending, which may increase the likelihood that the electrical connection between the flexible interposer 110 and the semiconductor device 140 remains intact as well as the electrical connection between the flexible interposer 110 and the board 150.

FIGS. 2A-2G show the formation of a semiconductor device assembly 100A that includes a flexible interposer 110 connected to a semiconductor device, a semiconductor device assembly 100B that includes a flexible interposer 110 and semiconductor device 140 connected to a board 150, and a semiconductor device assembly 100C that includes a flexible interposer 110 and semiconductor device 140 positioned within a cavity 160 of a board 150.

Figure 2A:
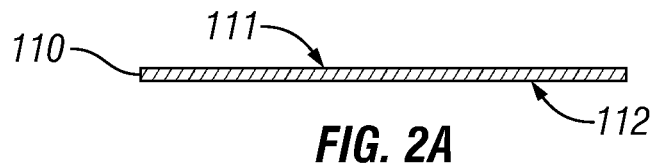
FIG. 2A is a schematic cross-sectional view of an embodiment of a flexible interposer.

FIG. 2A is a schematic of an embodiment of a flexible interposer 110 having a first surface 111 and a second surface 112 opposite of the first surface 111. The flexible interposer 110 may be fabricated via an additive manufacturing process, such as, but not limited to, 3D printing, rapid prototyping, direct digital manufacturing, layered manufacturing and additive fabrication, or the like. The flexible interposer 110 may be comprised of acrylonitrile butadiene styrene, polylactic acid, high impact polystyrene, thermoplastic polyurethane, polydimethylsiloxane, epoxy-based negative photoresist, liquid crystal polymer, a combination thereof, or the like. The flexible interposer 110 may be more flexible than a semiconductor device to be connected to the flexible interposer 110. The flexible nature of the flexible interposer 110 may redistribute stress on the semiconductor device. Electrical paths may be formed on and/or within the flexible interposer 110 during the additive manufacturing to enable the flexible interposer 110 to electrically connect two devices, such as a semiconductor device and a board, as would be appreciated by one of ordinary skill in the art having the benefit of this disclosure.

Figure 2B:
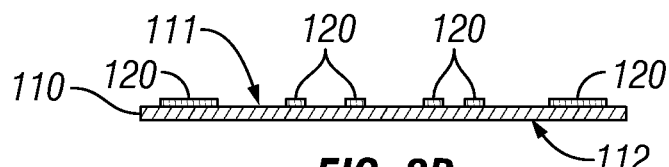
FIG. 2B is a schematic cross-sectional view of an embodiment of a flexible interposer having a first redistribution layer.

FIG. 2B is a schematic of a flexible interposer 110 having a first redistribution layer 120 formed on the first surface 111 of the flexible interposer 110. As discussed herein, the first redistribution layer 120 may be deposited onto the first surface 111 of the flexible interposer 110 by various processes performed in a clean room environment. For example, the first redistribution layer 120 may be deposited via a chemical deposition process or a physical deposition process performed in a clean room environment. For example, the first redistribution layer 120 may be deposited via chemical vapor deposition, plasma enhanced chemical vapor deposition, atomic layer deposition, molecular layer deposition, physical vapor deposition, thermal evaporation, sputtering deposition, or the like. The process of depositing the first redistribution layer 120 may enable the first redistribution layer 120 to have attachment features smaller than 30 μm.

The first redistribution layer 120 may be comprised of various materials that enable the electrical connection to a semiconductor device attached to the interposer 110 via the first redistribution layer 120 as discussed herein. For example, the first redistribution layer 120 may be, but is not limited to, gold, titanium, silver, copper, aluminum, platinum, a combination thereof, or the like. The number, size, shape, location, and/or configuration of the first redistribution layer 120 is shown in FIG. 2B for illustrative purposes and may be varied depending on the application as would be appreciated by one of ordinary skill in the art having the benefit of this disclosure.

Figure 2C:
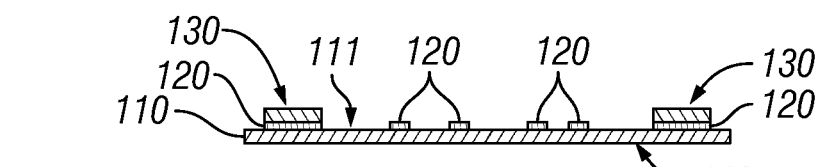
FIG. 2C is a schematic cross-sectional view of an embodiment of a flexible interposer having a first redistribution layer and a second redistribution layer.

FIG. 2C is a schematic of a flexible interposer 110 having a first redistribution layer 120 formed on the first surface 111 of the flexible interposer 110 and a second redistribution layer 130 formed on a portion of the first redistribution layer 120. As discussed herein, the second redistribution layer 130 may be formed on the first redistribution layer 120 by various additive manufacturing processes. For example, the second redistribution layer 130 may be 3D printed onto a portion of the first redistribution layer 120 on the first surface 111 of the flexible interposer 110 using a 3D printer. The second redistribution layer 130 may be formed on the first redistribution layer 120 by various other additive manufacturing processes, such as but not limited to, liquid dispense, aerosol jet dispense, ink-jet dispense, screen printing, or the like.

The second redistribution layer 130 may be comprised of various materials that enable the electrical connection to an electronic device, such as a board 150, to be attached to the interposer 110 via the second redistribution layer 130 as discussed herein. For example, the second redistribution layer 130 may be, but is not limited to, silver-based conductive ink, copper-based conductive ink, platinum-based conductive ink, a combination thereof, or the like. The number, size, shape, location, and/or configuration of the second redistribution layer 130 is shown in FIG. 2C for illustrative purposes and may be varied depending on the application as would be appreciated by one of ordinary skill in the art having the benefit of this disclosure.

Figure 2D:
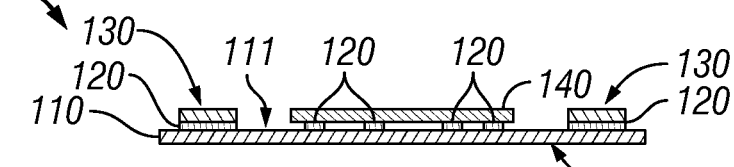
FIG. 2D is a schematic cross-sectional view of an embodiment of a semiconductor device assembly including a semiconductor device attached to a flexible interposer via a first redistribution layer.

FIG. 2D is a schematic of an embodiment of a semiconductor device assembly 100A that includes a semiconductor device 140 attached to the flexible interposer 110 via the first redistribution layer 120 deposited on the first surface 111 of the flexible interposer 110. The first redistribution layer 120 electrically connects the semiconductor device 140 to the flexible interposer 110 as discussed herein. The semiconductor device 140 may be various devices depending on the application as would be appreciated by one of ordinary skill in the art having the benefit of this disclosure. For example, the semiconductor device 140 may be, but is not limited to, a microchip. The number, size, shape, location, and/or configuration of the semiconductor device 140 is shown in FIG. 2D for illustrative purposes and may be varied depending on the application as would be appreciated by one of ordinary skill in the art having the benefit of this disclosure. For example, more than one semiconductor device 140 may be attached to the flexible interposer 110 via the first redistribution layer 120.

Figure 2E:
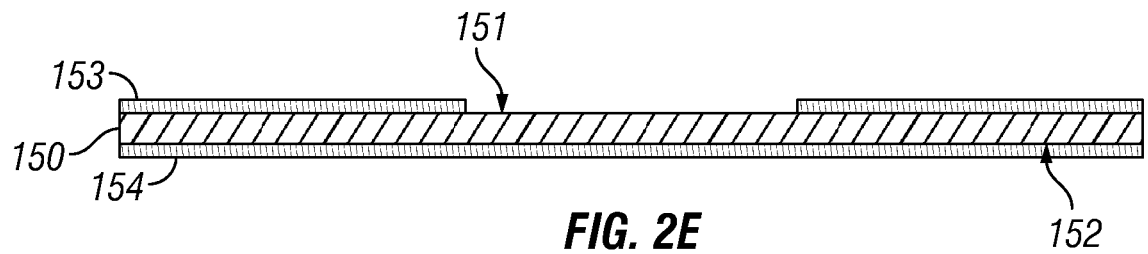
FIG. 2E is a schematic cross-sectional view of an embodiment of a board.

FIG. 2E shows a schematic of an embodiment of a board 150, which may be a printed circuit board (PCB), that may be connected to a flexible interposer 110. The board 150 includes a first surface, or side, 151 and a second surface, or side, 152. The first surface 151 of the board 150 may include an electrical flow path 153, which may be used to electrically connect the board 150 to another device, such as the flexible interposer 110, as would be appreciated by one of ordinary skill in the art having the benefit of this disclosure. The second surface 152 of the board 150 may include a ground plane 154. The number, size, shape, location, and/or configuration of the board 150, electrical flow path 153, and ground plane 154 are shown in FIG. 2E for illustrative purposes and may be varied depending on the application as would be appreciated by one of ordinary skill in the art having the benefit of this disclosure.

Figure 2F:
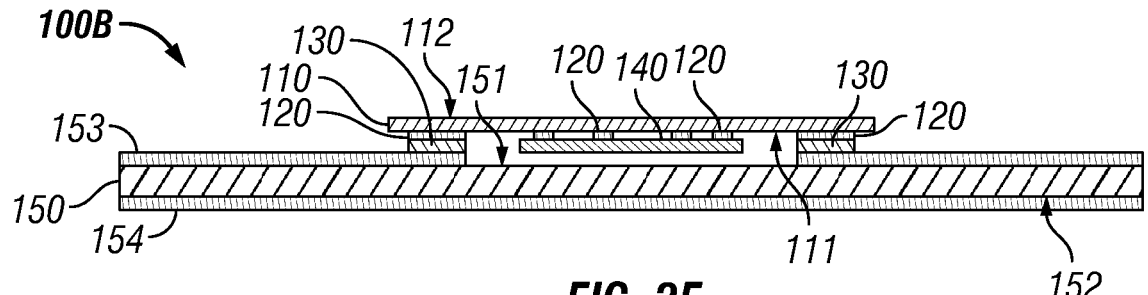
FIG. 2F is a schematic cross-sectional view of an embodiment of semiconductor device assembly.

FIG. 2F is a schematic of an embodiment of semiconductor device assembly 100B. The electrical flow path 153 of the board 150 is electrically connected to the flexible interposer 110 via the second redistribution layer 130. The semiconductor device 140 attached to the flexible interposer 110 is electrically connected to the board 150 via the first redistribution layer 120, the electrical flow paths of the flexible interposer 110, the second redistribution layer 130, and the electrical flow path 153 of the board 150. The board 150 may be used to electrically connect the semiconductor device assembly 100B to another device or system as would be appreciated by one of ordinary skill in the art having the benefit of this disclosure.

Figure 2G:
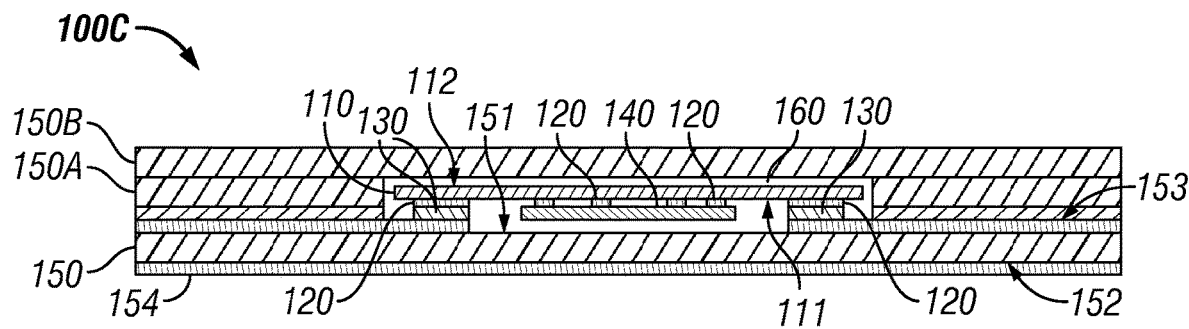
FIG. 2G is a schematic cross-sectional view of an embodiment of semiconductor device assembly.

FIG. 2G is a schematic of an embodiment of semiconductor device assembly 100C. The semiconductor device assembly 100C includes additional board layers 150A, 150B that are attached to the board 150 to create a cavity 160. The flexible interposer 110 and attached semiconductor device 140 are positioned within the cavity 160, which may protect the semiconductor device 140 and flexible interposer 110. The additional board layers 150A, 150B may be attached to the board 150 after the flexible interposer 110 is connected to the board 150. The number, size, shape, location, and/or configuration of the additional board layers 150A, 150B and cavity 160 are shown in FIG. 2G for illustrative purposes and may be varied depending on the application as would be appreciated by one of ordinary skill in the art having the benefit of this disclosure. For example, the semiconductor device assembly 100C may have more, or less, than two additional board layers 150A, 150B.

Figure 3:
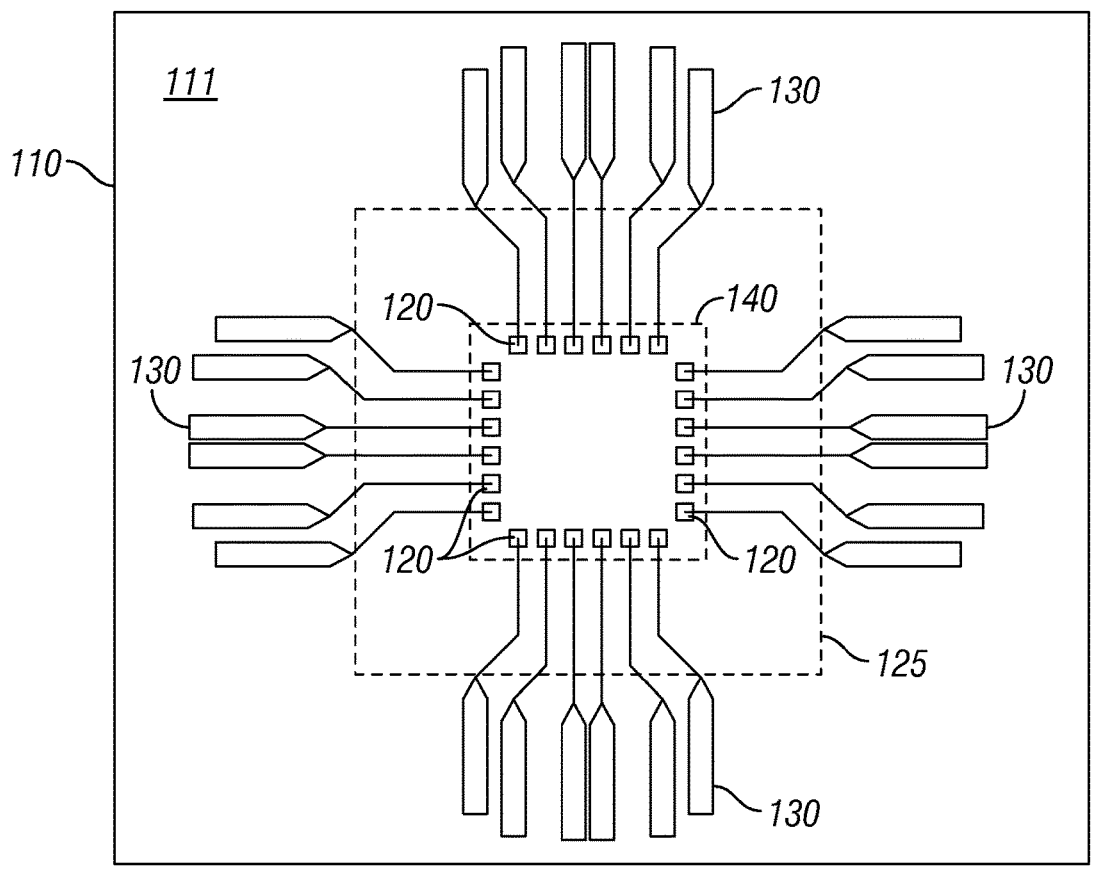
FIG. 3 is a schematic top view of a flexible interposer having a first redistribution layer and a second redistribution layer.

FIG. 3 is a schematic of a flexible interposer 110 having a first redistribution layer 120 and a second redistribution layer 130 on a surface 111 of the flexible interposer 110. As discussed herein, the second redistribution layer 130 may be formed onto a portion of the first redistribution layer 120. The first redistribution layer 120 may be all electrical connections provided to electrically connect a semiconductor device 140 (shown in dash). For example, the first redistribution layer 120 may be considered all the electrical connections positioned within dashed box 125. The second redistribution layer 130 may be all the connections configured to electrically connect the flexible interposer 110 to another device. For example, the second redistribution layer 130 may be considered all the electrical connections positioned outside dashed box 125. The number, size, shape, location, and/or configuration of the first redistribution layer 120 and second redistribution layer 130 are shown in FIG. 3 for illustrative purposes and may be varied depending on the application as would be appreciated by one of ordinary skill in the art having the benefit of this disclosure.

Figure 4:
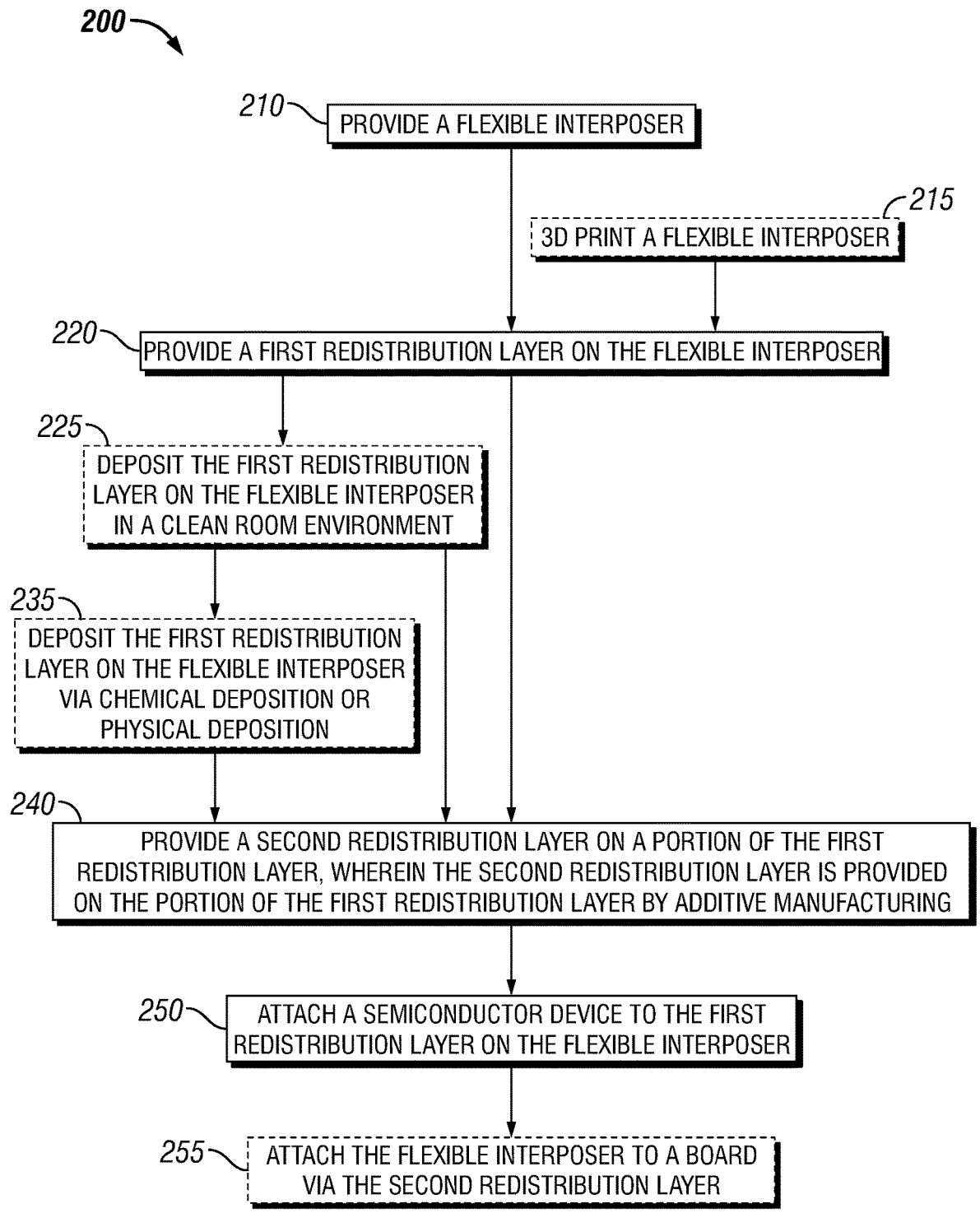
FIG. 4 is a flow chart for an embodiment of a method of providing a semiconductor device assembly.

FIG. 4 is a flow chart for an embodiment of a method 200 of providing a semiconductor device assembly. The method 200 includes providing a flexible interposer, at 210. For example, a flexible interposer 110 having electrical paths may be provided. The flexible interposer 110 may be comprised of acrylonitrile butadiene styrene, polylactic acid, high impact polystyrene, thermoplastic polyurethane, polydimethylsiloxane, epoxy-based negative photoresist, liquid crystal polymer, a combination thereof, or the like. The method 200 may include 3D printing the flexible interposer, at 215. For example, various additive manufacturing processes may be used to provide a flexible interposer 110.

The method 200 includes providing a first redistribution layer on the flexible interposer, at 220. The method 200 may include depositing the first redistribution layer on the flexible interposer in a clean room environment, at 225. The method 200 may include depositing the first redistribution layer on the flexible interposer via chemical deposition or physical deposition, at 235. For example, a first redistribution layer 120 may be deposited on a surface 111 of a flexible interposer 110 via chemical vapor deposition, plasma enhanced chemical vapor deposition, atomic layer deposition, molecular layer deposition, physical vapor deposition, thermal evaporation, sputtering deposition, or the like.

The method 200 include providing a second redistribution layer on a portion of the first redistribution layer 120, wherein the second redistribution layer is provided on the portion of the first redistribution layer 120 by additive manufacturing, at 240. For example, a second redistribution layer 130 may be formed on a portion of the first redistribution layer 120 via 3D printing or other additive manufacturing processes, such as but not limited to, liquid dispense, aerosol jet dispense, ink-jet dispense, screen printing, or the like. The second redistribution layer 130 may be formed onto a portion of a first redistribution layer 120 to electrically connect the second redistribution layer 130 to the first redistribution layer 120. The method 200 includes attaching a semiconductor device to the first redistribution layer on the flexible interposer, at 250. For example, a semiconductor device 140 may be attached to the first redistribution layer 120 on a surface 111 of a flexible interposer 110.

The method 200 may include attaching the flexible interposer to a board via the second redistribution layer, at 255. For example, a board 150 may be attached to a flexible interposer 110 via a second redistribution layer 130 on a portion of a first redistribution layer 120 on a surface 111 of the flexible interposer 110.

Figure 5:
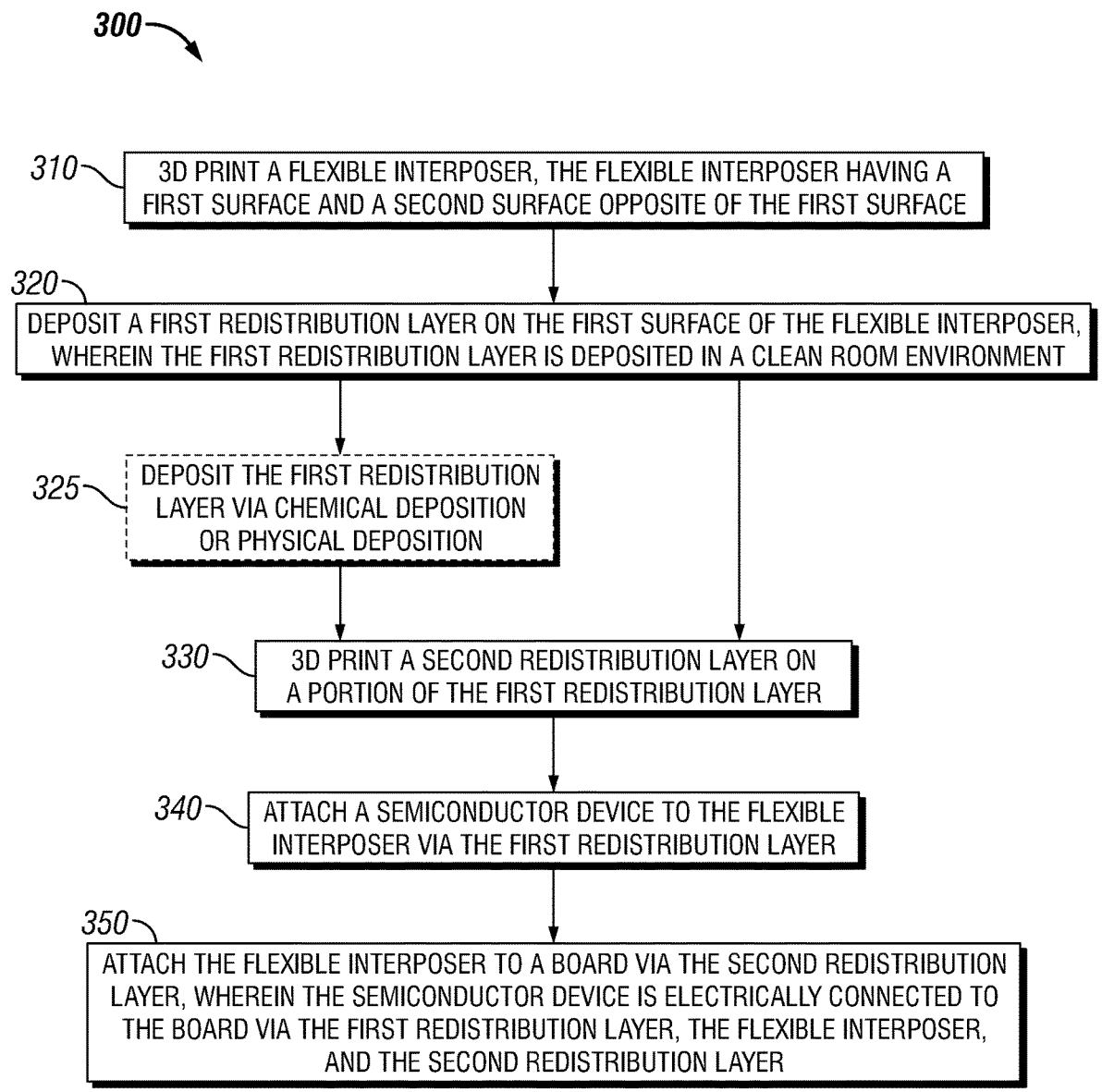
FIG. 5 is a flow chart for an embodiment of a method of providing a semiconductor device assembly.

FIG. 5 is a flow chart for an embodiment of a method 300 of manufacturing a semiconductor device assembly. The method 300 includes 3D printing a flexible interposer, the flexible interposer having a first surface and a second surface opposite of the first surface, at 310. For example, a 3D printer may be used to print a flexible interposer 110 having a first surface 111 and a second surface 112 that is opposite of the first surface 111. The method 300 includes depositing a first redistribution layer on the first surface of the flexible interposer, wherein the first redistribution layer is deposited in a clean room environment, at 320. The method 300 may include depositing the first redistribution layer via chemical deposition or physical deposition, at 325. For example, a first redistribution layer 120 may be deposited onto a flexible interposer 110 via chemical vapor deposition, plasma enhanced chemical vapor deposition, atomic layer deposition, molecular layer deposition, physical vapor deposition, thermal evaporation, sputtering deposition, or the like.

The method 300 includes 3D printing a second redistribution layer on a portion of the first redistribution layer, at 330. For example, a second redistribution layer may be 3D printed onto a portion of a first redistribution layer 120 located on a first surface 111 of a flexible interposer 110. The method 300 includes attaching a semiconductor device to the flexible interposer via the first redistribution layer, at 340. The method 300 includes attaching the flexible interposer to a board via the second redistribution layer, wherein the semiconductor device is electrically connected to the board via the first redistribution layer, the flexible interposer, and the second redistribution layer, at 350.

Although this disclosure has been described in terms of certain embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof.

What is claimed is:

1. A method of providing a semiconductor device assembly, the method comprising:
   electrically connecting a semiconductor device directly to a first redistribution layer on a flexible interposer having a first side and a second side opposite the first side, the flexible interposer having a second redistribution layer on a portion of the first redistribution layer, wherein the second redistribution layer is provided on the portion of the first redistribution layer by additive manufacturing and wherein the first redistribution layer and the second redistribution layer are both positioned adjacent to the first side of flexible interposer.

2. The method of providing the semiconductor device assembly of claim 1, further comprising enabling the flexible interposer to be more flexible than the semiconductor device.

3. The method of providing the semiconductor device assembly of claim 1, further comprising printing the flexible interposer using 3D printing.

4. The method of providing the semiconductor device assembly of claim 3, further comprising forming the first redistribution layer to include attachment features smaller than 30 µm.

5. The method of providing the semiconductor device assembly of claim 3, wherein providing the first redistribution layer on the flexible interposer comprises depositing the first redistribution layer on the flexible interposer.

6. The method of providing the semiconductor device assembly of claim 5, wherein depositing the first redistribution layer on the flexible interposer comprises depositing in a clean room environment.

7. The method of providing the semiconductor device assembly of claim 6, wherein depositing the first redistribution layer on the flexible interposer comprises depositing the first redistribution layer via chemical deposition or physical deposition.

8. The method of providing the semiconductor device assembly of claim 7, wherein depositing the first redistribution layer via chemical deposition comprises one of chemical vapor deposition, plasma enhanced chemical vapor deposition, atomic layer deposition, or molecular layer deposition.

9. The method of providing the semiconductor device assembly of claim 7, wherein depositing the first redistribution layer via physical deposition comprises one of physical vapor deposition, thermal evaporation, or sputtering deposition.

10. The method of providing the semiconductor device assembly of claim 1, further comprising electrically connecting the flexible interposer to a board via the second redistribution layer.

11. The method of providing the semiconductor device assembly of claim 1, further comprising electrically connecting the flexible interposer to a flexible hybrid electronic (FHE) board via the second redistribution layer.

12. A semiconductor device assembly comprising:
    a flexible interposer having a first surface and a second surface opposite of the first surface;
    a first redistribution layer deposited onto the first surface of the flexible interposer, wherein the first redistribution layer includes attachment features smaller than 30 µm;
    a second redistribution layer 3D printed onto a portion of the first redistribution layer, wherein the first redistribution layer and the second redistribution layer are both positioned adjacent to the first surface of the flexible interposer; and
    a semiconductor device electrically connected directly to the first surface of the flexible interposer via the first redistribution layer.

13. The semiconductor device assembly of claim 12, wherein the flexible interposer is more flexible than the semiconductor device.

14. The semiconductor device assembly of claim 13, wherein the flexible interposer is comprised of one of acrylonitrile butadiene styrene, polylactic acid, high impact polystyrene, thermoplastic polyurethane, polydimethylsiloxane, epoxy-based negative photoresist, liquid crystal polymer, or a combination thereof.

15. The semiconductor device assembly of claim 14, wherein the first redistribution layer is comprised of one of gold, titanium, silver, copper, aluminum, platinum, or a combination thereof.

16. The semiconductor device assembly of claim 15, wherein the second redistribution layer is comprised of one of silver-based conductive ink, copper-based conductive ink, platinum-based conductive ink, or a combination thereof.

17. The semiconductor device assembly of claim 12, further comprising a board, wherein the flexible interposer is electrically connected to the board via the second redistribution layer and wherein the semiconductor device is electrically connected to the board via the first redistribution layer, the flexible interposer, and the second redistribution layer.

18. The semiconductor device assembly of claim 17, further comprising additional layers attached to the board, wherein the flexible interposer and semiconductor device are positioned within a cavity within the board.

19. A method of manufacturing a semiconductor device assembly, the method comprising:
- 3D printing a flexible interposer, the flexible interposer having a first surface and a second surface opposite of the first surface;
- depositing a first redistribution layer on the first surface of the flexible interposer, wherein the first redistribution layer is deposited in a clean room environment;
- 3D printing a second redistribution layer on a portion of the first redistribution layer, wherein the first redistribution layer and the second redistribution layer are both positioned adjacent to the first surface of the flexible interposer;
- electrically connecting a semiconductor device to the flexible interposer via the first redistribution layer; and
- electrically connecting the flexible interposer to a board via the second redistribution layer, wherein the semiconductor device is electrically connected to the board via the first redistribution layer, the flexible interposer, and the second redistribution layer.

20. The method of manufacturing the semiconductor device assembly of claim 19, wherein depositing the first redistribution layer on the first surface of the flexible interposer comprises depositing the first redistribution layer via chemical deposition or physical deposition.

* * * * *